United States Patent
Vollrath

(10) Patent No.: US 7,626,870 B2
(45) Date of Patent: Dec. 1, 2009

(54) SEMICONDUCTOR DEVICE WITH A PLURALITY OF ONE TIME PROGRAMMABLE ELEMENTS

(75) Inventor: Joerg Vollrath, Olching (DE)

(73) Assignee: Qimonda AG, Munich (DE)

( * ) Notice: Subject to any disclaimer, the term of this patent is extended or adjusted under 35 U.S.C. 154(b) by 65 days.

(21) Appl. No.: 11/958,639

(22) Filed: Dec. 18, 2007

(65) Prior Publication Data
US 2008/0151594 A1 Jun. 26, 2008

(30) Foreign Application Priority Data
Dec. 18, 2006 (DE) .................... 10 2006 059 743

(51) Int. Cl.
*G11C 17/16* (2006.01)
(52) U.S. Cl. ............... 365/189.011; 365/96; 365/225.7
(58) Field of Classification Search ............ 365/94, 365/100, 103
See application file for complete search history.

(56) References Cited

U.S. PATENT DOCUMENTS

| 4,763,305 | A | * | 8/1988 | Kuo .................... 365/185.22 |
| 4,809,231 | A | * | 2/1989 | Shannon et al. ............ 365/201 |
| 5,966,339 | A | | 10/1999 | Hsu et al. |
| 6,707,696 | B1 | * | 3/2004 | Turner et al. ............... 365/96 |
| 6,728,137 | B1 | * | 4/2004 | Lin ...................... 365/185.05 |
| 7,254,086 | B2 | * | 8/2007 | Lin et al. ............... 365/230.03 |

* cited by examiner

*Primary Examiner*—Tan T. Nguyen
(74) *Attorney, Agent, or Firm*—Dicke, Billig & Czaja, PLLC

(57) ABSTRACT

A semiconductor device with a plurality of one time programmable elements and to a method for programming a semiconductor device, and to a method for operating a semiconductor device is disclosed. One embodiment provides a method for programming a semiconductor device comprising a plurality of one time programmable elements that form a group of one time programmable elements. The one time programmable elements of the group are left in a non-programmed state if a first information is to be stored by the group. A first one time programmable element of the group is programmed if a second information differing from the first information is to be stored by the group.

19 Claims, 3 Drawing Sheets

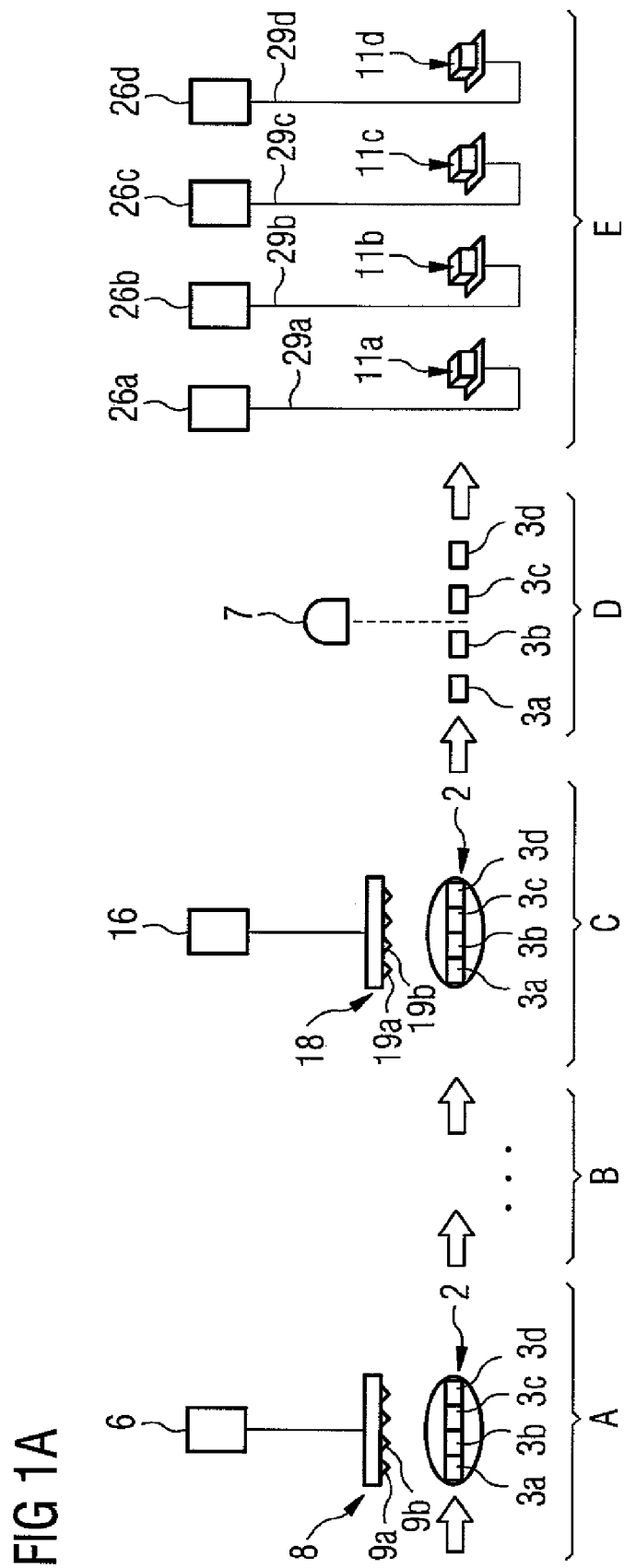

SEMICONDUCTOR DEVICE WITH A PLURALITY OF ONE TIME PROGRAMMABLE ELEMENTS

CROSS-REFERENCE TO RELATED APPLICATIONS

This Utility Patent Application claims priority to German Patent Application No. DE 10 2006 059 743.5 filed on Dec. 18, 2006, which is incorporated herein by reference.

BACKGROUND

The invention relates to a semiconductor device, in one embodiment a DRAM, with a plurality of one time programmable elements, to method for programming a semiconductor device, and to a method for operating a semiconductor device.

Semiconductor devices, e.g., corresponding, integrated (analog or digital) computing circuits, semiconductor memory devices such as, for instance, functional memory devices (PLAs, PALs, etc.) and table memory devices (e.g., ROMs or RAMs, in one embodiment SRAMs and DRAMs), etc. are subject to comprehensive tests during and after their manufacturing processes.

For the common manufacturing of a plurality of (in general identical) semiconductor devices, a wafer (i.e. a thin disc of monocrystalline silicon) is used. The wafer is processed appropriately (e.g., subject successively to a plurality of coating, exposure, etching, diffusion, and implantation process steps, etc.), and subsequently e.g., sawn apart (or e.g., scratched, and broken), so that the individual devices are then available.

During the manufacturing of semiconductor devices (e.g., of DRAMS (Dynamic Random Access Memories or dynamic read-write memories)), in one embodiment DDR-DRAMs (Double Data Rate-DRAMs)—even before all the desired, above-mentioned processing steps were performed on the wafer—(i.e. already in a semi-finished state of the semiconductor devices) the (semi-finished) devices (that are still available on the wafer) may be subject to appropriate tests at one or a plurality of test stations by using one or a plurality of test devices (e.g., kerf measurements at the wafer kerf).

After the finishing of the semiconductor devices (i.e. after the performing of all the above-mentioned wafer processing steps), the semiconductor devices are subject to further tests at one or a plurality of (further) test stations—for instance, by using appropriate (further) test devices, the finished devices—that are still available on the wafer—may be tested appropriately (so-called "wafer tests").

Correspondingly, one or a plurality of further tests (at corresponding further test stations, and by using appropriate, further test devices) may be performed, for instance, after the incorporation of the semiconductor devices in the corresponding semiconductor device packages, and/or e.g., after the incorporation of the semiconductor device packages (along with the respectively included semiconductor devices) in corresponding electronic modules, e.g., memory modules (so-called "module tests").

Based on the results of the above-mentioned tests it is possible to perform appropriate parameter settings with the above-mentioned semiconductor devices ("trimming").

For instance, reference voltages and/or reference currents may be trimmed such that they correspond as exactly as possible to respectively predetermined target values.

When trimming or setting the parameters, e.g., the above-mentioned reference voltages and/or reference currents, appropriate laser fuse methods, and/or e.g., appropriate electric fuse methods, etc. may, for instance, be used.

In a laser fuse method, it is possible to burn away portions of a one time programmable element, e.g., of a corresponding laser fuse resistor, by using a laser beam, and it is thus possible to place the laser fuse resistor from a conductive, first state ("non-programmed state") in a non-conductive, second state ("programmed state").

The conductive state corresponds, for instance, to a stored bit "0" (or "1"), and the non-conductive state, for instance, to a stored bit "1" (or "0").

Correspondingly similar, in an electrical fuse method it is possible, by applying a corresponding programming current pulse to a one time programmable element, e.g., a corresponding E-fuse resistor, to fuse or burn through the resistor. Thus—again—the resistor is placed from a conductive, first state ("non-programmed" state) in a non-conductive, second state ("programmed state").

Except for setting or trimming the above-mentioned semiconductor device parameters, e.g., corresponding reference voltages and/or reference currents, the above-mentioned one time programmable elements may also be used for numerous other applications, e.g., for activating/deactivating corresponding chip regions or chip function blocks, etc.

It is of disadvantage that a programming of an E- or laser fuse element that has once been performed is irreversible, i.e. cannot be undone anymore—a corresponding E- or laser fuse element can thus be programmed one single time only.

If a multiple programming function is desired, other memory elements instead of the above-mentioned E- or laser fuse elements, e.g., appropriate flash memories, have to be used. These are relatively expensive.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1a a schematic representation of stations that are run through during the manufacturing of corresponding semiconductor devices, and of a plurality of test devices used for testing the semiconductor devices;

FIGS. 1a and 1b illustrate—schematically—some (out of a plurality of further, not illustrated) stations A, B, C, D, E, F, G that are run through by corresponding semiconductor devices 3a, 3b, 3c, 3d during the manufacturing of semiconductor devices 3a, 3b, 3c, 3d.

DETAILED DESCRIPTION

Figure 1B:
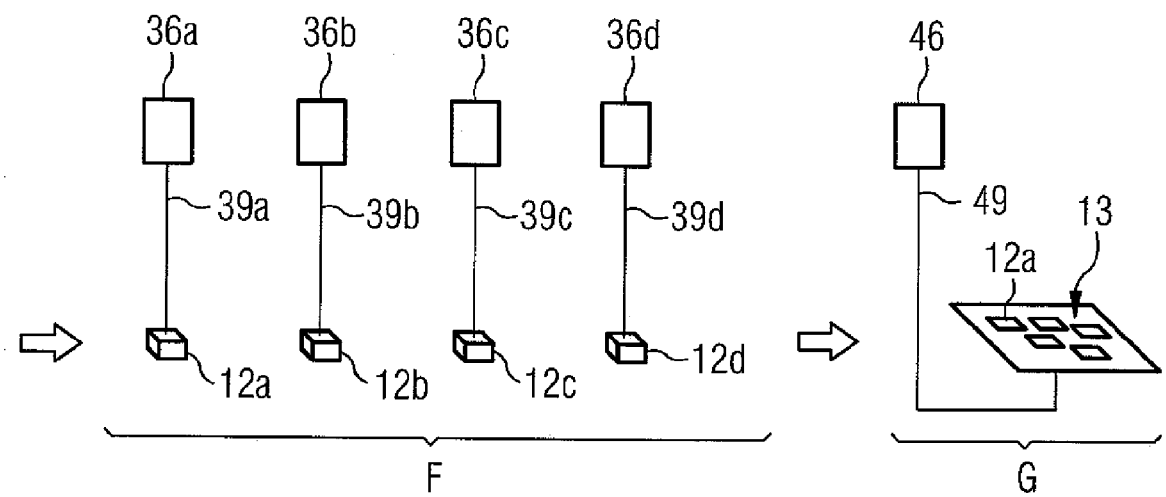
FIG. 1b illustrates is a schematic representation illustrating further stations that are run through during the manufacturing of corresponding semiconductor devices, and of a plurality of further test devices used for testing the semiconductor devices.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a semiconductor device, in one embodiment a DRAM, including a plurality of one time programmable elements, and a method for programming, as well as a method for operating a semiconductor device, in one embodiment a DRAM.

In accordance with one embodiment there is provided a method for programming a semiconductor device including a plurality of one time programmable elements that form a group of one time programmable elements. The method includes:

(a) leaving the one time programmable elements of the group in a non-programmed state if a first information is to be stored by the group; and (b) programming a first one time programmable element of the group if a second information differing from the first information is to be stored by the group.

In one embodiment, the method additionally includes the process of:

(c) after the process (b) of the programming of the first one time programmable element of the group, programming a second one time programmable element of the group if the first information is to be stored again by the group.

In one embodiment there is provided a semiconductor device including a plurality of one time programmable elements that form a group of one time programmable elements for the joint storing of a first information or a second information differing from the first information.

In one embodiment, the semiconductor device may additionally include evaluation means for determining that the second information (or the first information) is stored by the group if an odd number of the one time programmable elements of the group is in a programmed state (or an even number of the one time programmable elements of the group is in a non-programmed state).

The semiconductor devices 3a, 3b, 3c, 3d may, for instance, be corresponding, integrated (analog or digital) computing circuits, and/or semiconductor memory devices such as e.g., functional memory devices (PLAs, PALs, etc.) or table memory devices (e.g., ROMs or RAMS), in one embodiment SRAMs or DRAMs (here e.g., DRAMs (Dynamic Random Access Memories or dynamic write-read memories) with double data rate (DDR-DRAMs=Double Data Rate-DRAMs), in one embodiment high-speed DDR-DRAMs).

During the manufacturing of the semiconductor devices 3a, 3b, 3c, 3d, an appropriate silicon disc or an appropriate wafer 2 is—e.g., at stations that are positioned upstream or downstream of the station A illustrated in FIG. 1a (e.g., at the station B that is positioned downstream of the station A, and at a plurality of further, not illustrated stations (that are positioned upstream or downstream of the station A)—subject to corresponding, conventional coating, exposure, etching, diffusion, and/or implantation processes, etc.

The station A serves to subject the semiconductor devices 3a, 3b, 3c, 3d—which are still available on the wafer 2—to one or a plurality of test methods—e.g., kerf measurements at the wafer kerf—by using a test device 6 (namely—as results from the above statements—even before all the desired, above-mentioned processes were performed at the wafer 2 (i.e. already in a semi-finished state of the semiconductor devices 3a, 3b, 3c, 3d).

The voltages/currents or test signals required at the station A for testing the semiconductor devices 3a, 3b, 3c, 3d on the wafer 2 are generated by the test device 6 and are applied to corresponding connections of the semiconductor devices 3a, 3b, 3c, 3d by using a semiconductor device test card 8 or probe card 8 (more exactly: by using corresponding contact needles 9a, 9b provided at the probe card 8) which is connected with the test device 6.

From the station A, the wafer 2 is (in one embodiment in a fully automated manner) transported forward to the station B (and from there possibly to a plurality of further—not illustrated—stations) where—as was already mentioned above—the wafer 2 is subject to appropriate, further processes in one embodiment appropriate coating, exposure, etching, diffusion, and/or implantation processes, etc.), and/or—correspondingly similar as at the station A—to corresponding further test methods.

After the finishing of the semiconductor devices (i.e. after the performing of all the above-mentioned wafer processes) the wafer 2 is, from the corresponding—last—processing station (e.g., the station B or the further stations positioned downstream thereof)—transported forward to the next station C—in one embodiment in a fully automated manner.

The station C serves to subject the finished semiconductor devices 3a, 3b, 3c, 3d—that are still available on the wafer 2—to one or a plurality of—further—test methods by using a test device 16 (e.g., wafer tests).

The voltages/currents or test signals required at the station C for testing the semiconductor devices 3a, 3b, 3c, 3d on the wafer 2 are generated by the test device 16 and are applied to corresponding connections of the semiconductor devices 3a, 3b, 3c, 3d by using a semiconductor device test card 18 or probe card 18 (more exactly: by using corresponding contact needles 19a, 19b that are provided at the probe card 18) which is connected with the test device 16.

From the station C, the wafer 2 is (in one embodiment in a fully automated manner) transported forward to the next station D, and is there (after the wafer 2 was laminated with a film in a per se known manner) sawn apart (or e.g., scratched, and broken) by using an appropriate machine 7, so that the semiconductor devices 3a, 3b, 3c, 3d are then available individually (as corresponding semiconductor device chips).

Prior to being transported forward to the station D, the wafer 2—or the devices 3a, 3b, 3c, 3d available thereon—may be subject to one or a plurality of further test methods at one or a plurality of stations corresponding to the station C.

After the sawing apart of the wafer 2 at the station D, every single device or every single chip 3*a*, 3*b*, 3*c*, 3*d* is then (in one embodiment—again—in a fully automated manner) loaded into an appropriate carrier 11*a*, 11*b*, 11*c*, 11*d* or an appropriate outer package 11*a*, 11*b*, 11*c*, 11*d*, and the semiconductor devices 3*a*, 3*b*, 3*c*, 3*d*—that are loaded into the carriers 11*a*, 11*b*, 11*c*, 11*d*—are subject to one or a plurality of further test methods (e.g., carrier tests) at one or a plurality of (further) test stations—e.g., the station E illustrated in FIG. 1*a*.

To this end, the carriers 11*a*, 11*b*, 11*c*, 11*d* are introduced into corresponding carrier sockets or carrier adapters, respectively, which are connected with one (or a plurality of) corresponding test device(s) 26*a*, 26*b*, 26*c*, 26*d* via corresponding lines 29*a*, 29*b*, 29*c*, 29*d*.

The voltages/currents or test signals required at the station E for testing the semiconductor devices 3*a*, 3*b*, 3*c*, 3*d* in the carriers 11*a*, 11*b*, 11*c*, 11*d* are generated by the test device(s) 26*a*, 26*b*, 26*c*, 26*d* and applied to corresponding connections of the semiconductor devices 3*a*, 3*b*, 3*c*, 3*d* via the carrier sockets that are connected with the test device(s) 26*a*, 26*b*, 26*c*, 26*d* via the lines 29*a*, 29*b*, 29*c*, 29*d*, and the carriers 11*a*, 11*b*, 11*c*, 11*d* that are connected thereto.

From the station E, the semiconductor devices 3*a*, 3*b*, 3*c*, 3*d* are (in one embodiment in a fully automated manner) transported forward to one or a plurality of—not illustrated—station(s) where the semiconductor devices 3*a*, 3*b*, 3*c*, 3*d* are incorporated into appropriate packages 12*a*, 12*b*, 12*c*, 12*d* (e.g., appropriate plug or surface-mountable device packages, etc.).

As is illustrated in FIG. 1*b*, the semiconductor devices 3*a*, 3*b*, 3*c*, 3*d*—that are incorporated in the packages 12*a*, 12*b*, 12*c*, 12*d*—are then transported forward to one (or a plurality of) further test station(s)—e.g., the station F illustrated in FIG. 1*b*—, and are subject to one or a plurality of further test methods there.

To this end, the semiconductor device packages 12*a*, 12*b*, 12*c*, 12*d* are introduced into appropriate device package sockets or device package adapters which are—via corresponding lines 39*a*, 39*b*, 39*c*, 39*d*—connected with one (or a plurality of) corresponding test device(s) 36*a*, 36*b*, 36*c*, 36*d*.

The voltages/currents or test signals required at the station F for testing the semiconductor devices 3*a*, 3*b*, 3*c*, 3*d*—that are incorporated in the packages 12*a*, 12*b*, 12*c*, 12*d*—are generated by the test device(s) 36*a*, 36*b*, 36*c*, 36*d* and are applied to corresponding connections of the semiconductor devices 3*a*, 3*b*, 3*c*, 3*d* via the package sockets that are, via the lines 39*a*, 39*b*, 39*c*, 39*d*, connected with the test device(s) 36*a*, 36*b*, 36*c*, 36*d*, and the device packages 12*a*, 12*b*, 12*c*, 12*d* that are connected thereto.

From the station F, the semiconductor devices 3*a*, 3*b*, 3*c*, 3*d* incorporated in the packages 12*a*, 12*b*, 12*c*, 12*d* may then—optionally—be transported forward to one or a plurality of—not illustrated—further station(s) where a corresponding semiconductor device package (e.g., the package 12*a* together with the semiconductor 3*a* incorporated therein) is—along with further devices (analog or digital computing circuits, and/or semiconductor memory devices, e.g., PLAs, PALs, ROMs, RAMS, in one embodiment SRAMs or DRAMs, etc.)—connected to a corresponding electronic module 13—e.g., a printed circuit board.

As is illustrated in FIG. 1*b*, the electronic module 13 (and thus also the semiconductor devices 3*a* that are connected to the electronic module 13 (and are incorporated in a corresponding package 12*a*)) may then—optionally—be transported forward to one (or a plurality of) further test station(s)—e.g., the station G illustrated in FIG. 1*b*—, and be subject there to one or a plurality of further test methods (in one embodiment module tests).

The voltages/currents or test signals required at the station G for testing the module 13 (and thus the semiconductor devices 3*a* incorporated therein) are, for instance, generated by a test device 46 and are applied, via a line 49, to the electronic module 13 and thus to the corresponding connections of the corresponding semiconductor devices 3*a* that are incorporated therein.

Based on the results of the above-mentioned test methods (or on the results of a part of the above-mentioned test methods), appropriate target values for parameters—e.g., appropriate reference voltages and/or reference currents—may be determined for future semiconductor devices to be manufactured (e.g., such that the semiconductor devices operate "optimally" with the predetermined parameter target values, e.g., with respect to reliability, and/or rate, and/or power consumption, etc.).

For trimming or setting the parameters, e.g., the above-mentioned reference voltages and/or reference currents in a future semiconductor device to be manufactured (e.g., in the semiconductor device 200 illustrated in FIG. 2, or in the semiconductor device 1200 illustrated in FIG. 3, etc.), the fuse method that will be explained in more detail in the following may, for instance be used (e.g., an appropriate laser fuse method, and/or an appropriate electrical fuse method, etc.):

First of all, for trimming the semiconductor device 200, 1200 with the corresponding semiconductor device 200, 1200, one or a plurality of the above-mentioned test methods (e.g., the above-mentioned test method performed at the station A, and/or C, and/or E, and/or F, and/or G, etc.), and/or one or a plurality of further test methods may be performed.

Based on the results of the above-mentioned test methods, in the semiconductor device 200, 1200, the above-mentioned parameters—e.g., the above-mentioned or further reference voltages and/or reference currents used on the semiconductor device, etc.—may, by using the fuse method that will be explained in more detail in the following—be trimmed such that they correspond as exactly as possible to the respective parameter target values determined in the above-mentioned manner.

The above-mentioned semiconductor devices 200, 1200 may, for instance—again correspondingly as explained above—be corresponding, integrated (analog or digital) computing circuits, and/or semiconductor memory devices such as e.g., functional memory devices (PLAs, PALs, etc.) or table memory devices (e.g., ROMs or RAMS), in one embodiment SRAMs or DRAMs (here e.g., DRAMs (Dynamic Random Access Memories or dynamic write-read memories) with double data rate (DDR-DRAMs=Double Data Rate-DRAMs), in one embodiment high-speed DDR-DRAMs).

Figure 2:
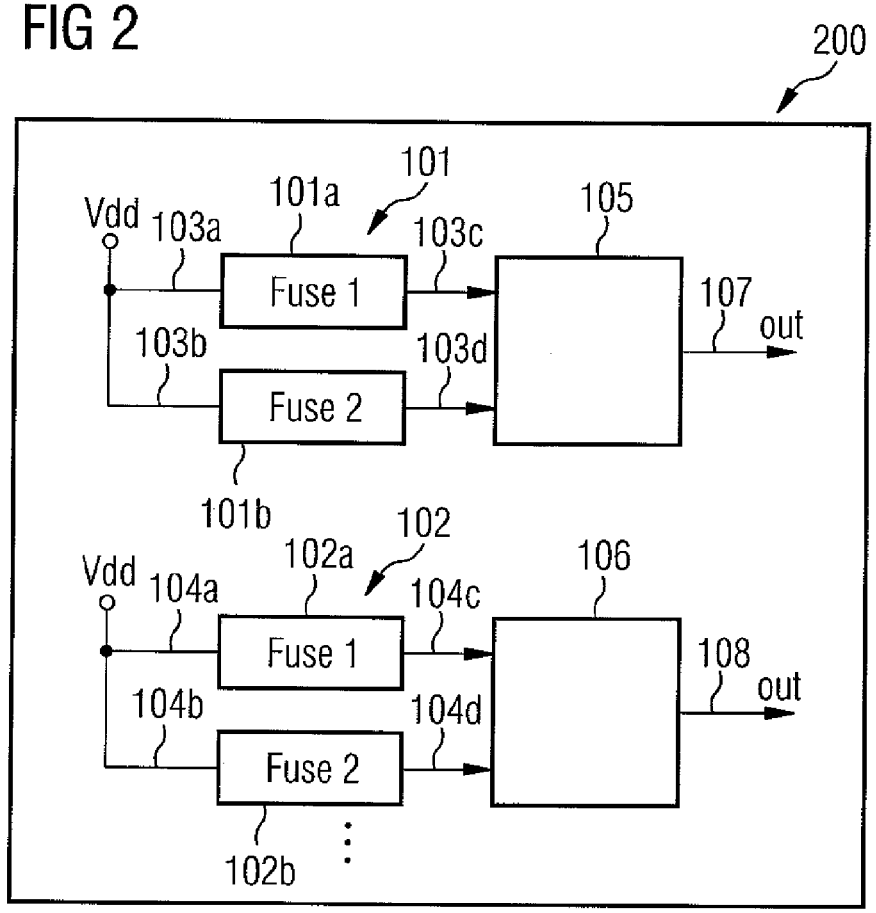
FIG. 2 illustrates an exemplary schematic representation of a semiconductor device including a plurality of one time programmable elements in accordance with one embodiment.

As is schematically illustrated in FIG. 2, for trimming the semiconductor device 200—other than conventionally—instead of (one or a plurality of) one time programmable (fuse) elements by using which one respective bit of information is stored, (one or a plurality of) groups 101, 102 of a plurality of one time programmable (fuse) elements 101*a*, 101*b*, 102*a*, 102*b* may be used, wherein one respective bit of information is stored with each element group 101, 102 in the manner that will be explained in more detail in the following.

Figure 3:
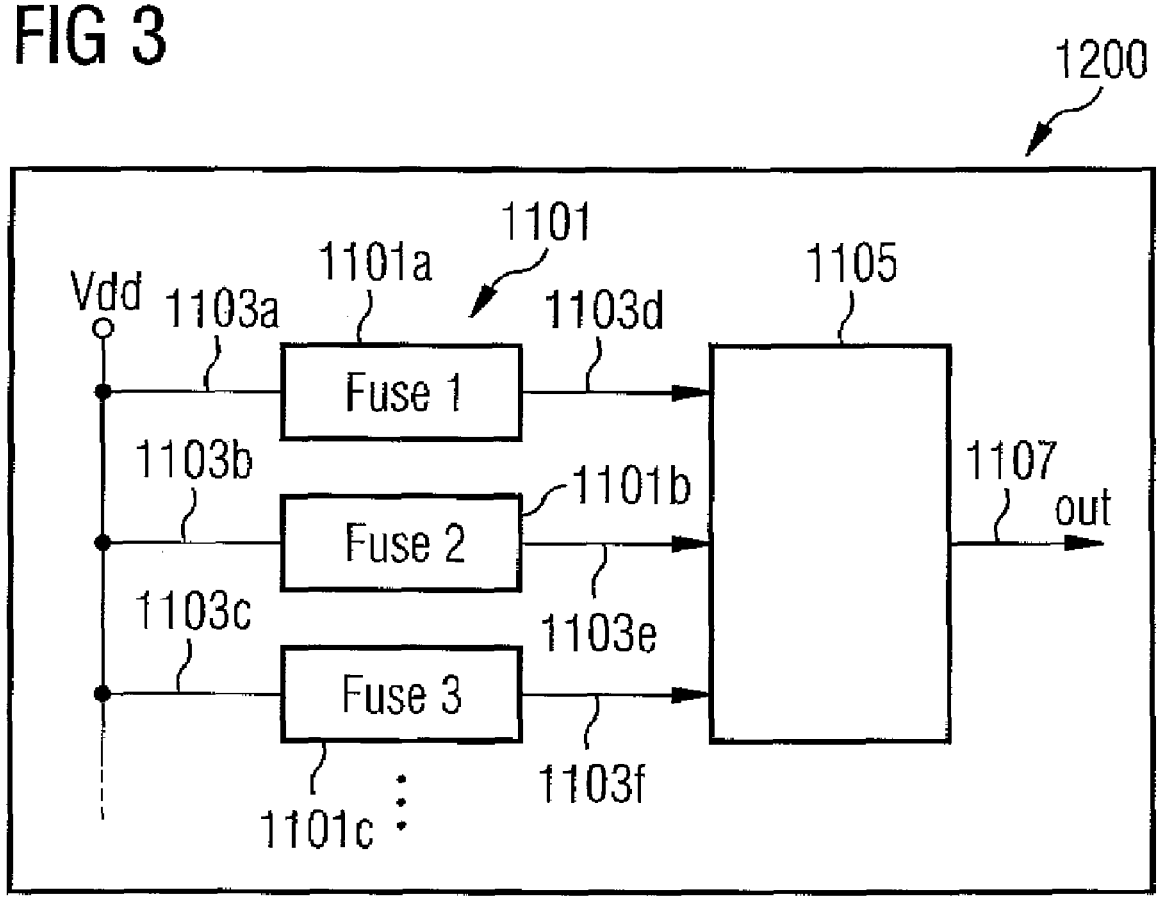
FIG. 3 illustrates an exemplary schematic representation of a semiconductor device including a plurality of one time programmable elements in accordance with one embodiment.

An element group 101, 102 may, for instance—as is illustrated in FIG. 2—each include two one time programmable elements 101*a*, 101*b*, 102*a*, 102*b*, or e.g., also more than two one time programmable elements 101a, 101b, 102a, 102b, e.g., three, four, or more than four one time programmable elements (cf. also the embodiment of a semiconductor device 1200 illustrated in FIG. 3, and the group 1101 of one time programmable elements with three or more one time programmable elements 1101a, 1101b, 1101c illustrated there, wherein one bit of information is stored with the element group 1101 in the manner that will be explained in more detail in the following).

A plurality of the above-mentioned element groups 101, 102, 1101 may be provided on the semiconductor devices 200, 1200, e.g., more than three, five, or ten element groups, etc.

In addition to the one or several element groups 101, 102, 110—which are each used for storing one bit of information—which each include a plurality of one time programmable elements 101a, 101b, 102a, 102b, 1101a, 1101b, 1101c, the semiconductor devices 200, 1200 may also include one or a plurality of conventional one time programmable elements which are each used for storing one bit of information.

These may then—along with the element groups 101, 102, 1101—be used for setting or trimming the above-mentioned semiconductor device parameters, e.g., corresponding reference voltages and/or reference currents (cf. below).

The above-mentioned one time programmable elements or element groups 101, 102, 1101 which are used for setting or trimming the above-mentioned semiconductor device parameters, e.g., corresponding reference voltages and/or reference currents, one or a plurality of further, conventional one time programmable elements, and/or element groups—that are structured and that operate correspondingly similar as illustrated in FIGS. 2 and 3—may be provided on the semiconductor devices 200, 1200, which are used for other applications than for setting or trimming the above-mentioned semiconductor device parameters, e.g., for activating/deactivating corresponding chip regions or chip function blocks on the semiconductor devices 200, 1200, etc.

The above-mentioned (fuse) elements 101a, 101b, 102a, 102b, 1101a, 1101b, 1101c of the above-mentioned element groups 101, 102, 1101 of the semiconductor devices 200, 1200 may, for instance, be E-fuse resistors 101a, 101b, 102a, 102b, 1101a, 1101b, 1101c—that are constructed similarly to conventional E-fuse resistors- , or laser fuse resistors 101a, 101b, 102a, 102b, 1101a, 1101b, 1101c, etc. that are constructed similarly to conventional laser fuse resistors.

If laser fuse resistors 101a, 101b, 102a, 102b, 1101a, 1101b, 1101c are used as (fuse) elements in the above-mentioned element groups 101, 102, 1101, it is possible, by using a corresponding laser fuse method, to burn away portions of a single element 101a, 102a, 1101a that has been selected in the way explained below (e.g., of a corresponding laser fuse resistor 101a, 102a, 1101a) of a corresponding element group 101, 102, 1101 by using a laser beam, and it is thus possible to place the corresponding laser fuse resistor 101a, 102a, 1101a from a conductive, first state ("non-programmed state") in a non-conductive, second state ("programmed state").

Correspondingly similar—if E-fuse resistors 101a, 101b, 102a, 102b, 1101a, 1101b, 1101c are used as (fuse) elements in the above-mentioned element groups 101, 102, 1101—it is possible, by using an appropriate electrical fuse method, by applying a corresponding programming current pulse to a single element 101a, 102a, 1101a that has been selected in the manner explained below (e.g., a corresponding E-fuse resistor 101a, 102a, 1101a) of a corresponding element group 101, 102, 1101, to fuse or burn through the corresponding E-fuse resistor 101a, 102a, 1101a.

Thus—again—the corresponding E-fuse resistor 101a, 102a, 1101a is placed from a conductive, first state ("non-programmed state") in a non-conductive, second state ("programmed state").

In a first (initial) state of the element groups 101, 102, 1101, all programmable elements 101a, 101b, 102a, 102b, 1101a, 1101b, 1101c of the respective group 101, 102, 1101 are in the above-mentioned first, conductive state ("non-programmed state").

This first (initial) state of the element groups 101, 102, 1101 corresponds, for instance, to a bit "0" (or "1") stored by the respective element group 101, 102, 1101:

As results from FIG. 2 and FIG. 3, a respective first connection of the programmable elements 101a, 101b, 102a, 102b, 1101a, 1101b, 1101c is, via a corresponding line 103a, 103b, 104a, 104b, 1103a, 1103b, 1103c, connected to a supply voltage (here: Vdd).

Furthermore, a respective second connection of the programmable elements 101a, 101b, 102a, 102b, 1101a, 1101b, 1101c is, via a corresponding line 103c, 103d, 104c, 104d, 1103d, 1103e, 1103f, connected to an evaluation logic circuit 105, 106, 1105, in one embodiment to an XOR gate (or another circuit fulfilling the function that will be explained in more detail below).

The evaluation logic circuits 105, 106 or XOR gates illustrated in FIG. 2 comprise, for instance, two inputs each, wherein a first input of the respective XOR gate is, for instance, connected to the above-mentioned second connection of the respective first programmable element 101a, 102a via the above-mentioned line 103c, 104c, and a respective second input of the respective XOR gate is, for instance, connected to the above-mentioned second connection of the respective second programmable element 101b, 102b via the above-mentioned line 103d, 104d.

Correspondingly, the evaluation logic circuit 1104 illustrated in FIG. 3 includes three (or more) inputs, wherein a first input of the evaluation logic circuit 1105 is, for instance, connected to the above-mentioned second connection of the first programmable element 1101a via the above-mentioned line 1103d, a second input of the evaluation logic circuit 1105 is, for instance, connected to the above-mentioned second connection of the second programmable element 1101b via the above-mentioned line 1103e, a third input of the evaluation logic circuit 1105 is, for instance, connected to the above-mentioned second connection of the third programmable element 1101c via the above-mentioned line 1103f, etc.

As results further from FIGS. 2 and 3, the output of the respective evaluation logic circuit 105, 106, 1105 is connected with a corresponding output line 107, 108, 1107.

Since—as has already been explained above—in the above-mentioned first (output) state of the element groups 101, 102, 1101, all programmable elements 101a, 101b, 102a, 102b, 1101a, 1101b, 1101c of the respective group 101, 102, 1101 are in the above-mentioned first, conductive state ("non-programmed state"), all inputs of the evaluation logic circuits 105, 106, 1105 are in the same (first) state that corresponds, for instance, to a logic "0" (or a logic "1").

The output of the evaluation logic circuits 105, 106, 1105—i.e. the output line 107, 108, 1107—is thus—also—in a (first) state, i.e. a logic "0" (or a logic "1").

In the first (output) state of the element groups 101, 102, 1101, they thus store—as mentioned above—a bit "0" (or a bit "1").

If, instead, a bit "1" (or a bit "0") is to be stored by a corresponding element group 101, 102, 1101, the respective element group 101, 102, 1101 is placed from the above-mentioned first (output) state in a second state.

In so doing, a first, predetermined element of the elements of the respective element group 101, 102, 1101 (e.g., the first element 101a of the element group 101, or the first element 102a of the element group 102, or the first element 101a of the element group 1101, etc.) is placed from the above-mentioned conductive, first state ("non-programmed state") in a non-conductive, second state ("programmed state").

If laser fuse resistors 101a, 101b, 102a, 102b, 1101a, 1101b, 1101c are used as (fuse) elements in the above-mentioned element groups 101, 102, 1101, it is possible, by using a corresponding laser fuse method, to burn away portions of the above-mentioned first element 101a, 102a, 1101a (e.g., of a corresponding laser fuse resistor 101a, 102a, 1101a) of the corresponding element group 101, 102, 1101 by using a laser beam, and it is thus possible to place the first laser fuse resistor 101a, 102a, 1101a from a conductive, first state ("non-programmed state") in a non-conductive, second state ("programmed state").

Correspondingly similar—if E-fuse resistors 101a, 101b, 102a, 102b, 101a, 1101b, 1101c are used as (fuse) elements in the above-mentioned element groups 101, 102, 1101—it is possible, by using an appropriate electrical fuse method, by applying a corresponding programming current pulse to the first element 101a, 102a, 1101a (e.g., a corresponding fuse resistor 101a, 102a, 1101a) of the corresponding element group 101, 102, 1101, to fuse or burn through the corresponding E-fuse resistor 101a, 102a, 1101a (and it is thus possible to place the corresponding, first E-fuse resistor 101a, 102a, 1101a from a conductive, first state ("non-programmed state") in a non-conductive, second state ("programmed state").

The corresponding programming current pulse may, for instance, be automatically generated by a control circuit in reaction to a programming instruction signal applied to the control circuit, and be applied to the respectively correct (here: the first) E-fuse resistor 101a, 102a, 1101a.

In the above-mentioned second state of the element group 101, 102, 1101, the first programmable element 101a, 102a, 1101a is thus in the above-mentioned second, non-conductive state ("programmed state"), and the remaining programmable elements 101b, 102b, 1101b, 1101c in the above-mentioned first, conductive state ("non-programmed state").

For this reason, the first input of the evaluation logic circuit 105, 106, 1105 is in a (second) state differing from the above-mentioned first state, which corresponds, for instance, to a logic "1" (or a logic "0"), and the second input (and possibly further inputs) of the evaluation logic circuit 105, 106, 1105 is/are—still—in the above-mentioned first state that corresponds, for instance, to a logic "0" (or to a logic "1").

The output of the evaluation logic circuits 105, 106, 1105—i.e. the output line 107, 108, 1107—is thus placed from the above-mentioned first state in a (second) state differing therefrom (logic "1" (or logic "0")).

In the above-mentioned second state of the element groups 101, 102, 1101 they thus store—as mentioned above—a bit "1" (or a bit "0").

Other than conventional, individually used one time programmable elements, the element groups 101, 102, 1101 illustrated in FIGS. 2 and 3 may subsequently be programmed again, or be reprogrammed—later—if required:

If a bit "0" (or a bit "1") is to be stored—again—by a corresponding element group 101, 102, 1101 instead of the last stored bit "1" (or "0"), the respective element group 101, 102, 1101 is placed from the above-mentioned second state in a third state:

In so doing, a second, predetermined element of the elements of the respective element group 101, 102, 1101 (e.g., the second element 101b of the element group 101, or the second element 102b of the element group 102, or the second element 1101b of the element group 1101, etc.) is placed from the above-mentioned conductive, first state ("non-programmed state") in a non-conductive, second state ("programmed state").

If laser fuse resistors 101a, 101b, 102a, 102b, 1101a, 1101b, 1101c are used as (fuse) elements in the above-mentioned element groups 101, 102, 1101, it is possible, by using a corresponding laser fuse method, to burn away portions of the above-mentioned second element 101b, 102b, 1101b (e.g., of a corresponding laser fuse resistor 101b, 102b, 1101b) of the corresponding element group 101, 102, 1101 by using a laser beam, and to thus place the second laser fuse resistor 101b, 102b, 1101b from a conductive, first state ("non-programmed state") in a non-conductive, second state ("programmed state").

Correspondingly similar—if E-fuse resistors 101a, 101b, 102a, 102b, 1101a, 1101b, 1101c are used as (fuse) elements in the above-mentioned element groups 101, 102, 1101—it is possible, by using a corresponding electrical fuse method, by applying a corresponding programming current pulse to the second element 101b, 102b, 1101b (e.g., a corresponding E-fuse resistor 101b, 102b, 1101b) of the corresponding element group 101, 102, 1101, to fuse or burn through the corresponding E-fuse resistor 101b, 102b, 1101b (and to thus place the corresponding, second E-fuse resistor 101b, 102b, 1101b from a conductive, first state ("non-programmed state") in a non-conductive, second state ("programmed state").

The corresponding programming current pulse may, for instance, be automatically generated by the control circuit in reaction to a corresponding further programming instruction signal—that is, for instance, identical to the above-mentioned first programming instruction signal—applied to the control circuit, and be applied to the respectively correct (here: the second) E-fuse resistor 101b, 102b, 1101b.

In the above-mentioned third state of the element group 101, 102, 1101, the first and second programmable elements 101a, 101b, 102a, 102b, 1101a, 1101b are thus in the above-mentioned second, non-conductive state ("programmed state"), and the remaining programmable elements 1101c (if available) in the above-mentioned first, conductive state ("non-programmed state").

For this reason, the first and second inputs of the evaluation logic circuit 105, 106, 1105 are in the above-mentioned second state that corresponds, for instance, to a logic "1" (or to a logic "0"), and the third input and further inputs (if available) of the evaluation logic circuit 1105 is/are—still—in the above-mentioned first state that corresponds, for instance, to a logic "0" (or to a logic "1").

The output of the evaluation logic circuits 105, 106, 1105—i.e. the output line 107, 108, 1107—is thus placed from the above-mentioned second state back to the above-mentioned first state (logic "0" (or logic "1")).

In the above-mentioned third state of the element groups 101, 102, 1101 they thus—again—store a bit "0" (or a bit "1").

If an element group includes more than two elements (cf. e.g., the element group 1101 illustrated in FIG. 3), the corresponding element group 1101 may, if required, be reprogrammed another time or be programmed again, respectively, later:

If, for instance, the element group 1101 is to store—again a bit "1" (or a bit "0") instead of the last stored bit "0" (or "1"), the element group 1101 is placed from the above-mentioned third state in a fourth state:

In so doing, a third, predetermined element of the elements of the element group 1001 (e.g., the third element 1101c) is placed from the above-mentioned conductive, first state ("non-programmed state") in a non-conductive, second state ("programmed state").

If laser fuse resistors 1101a, 1101b, 1101c are used as (fuse) elements in the element group 1101, it is possible, by using a corresponding laser fuse method, to burn away portions of the above-mentioned third element 1101c by using a laser beam, and to thus place the third laser fuse resistor 1101c from a conductive, first state ("non-programmed state") in a non-conductive, second state ("programmed state").

Correspondingly similar—if E-fuse resistors 1101a, 1101b, 1101c are used as (fuse) elements in the element group 1101—it is possible, by using a corresponding electrical fuse method, by applying a corresponding programming current pulse to the third element 1101c (e.g., a corresponding E-fuse resistor 1101c), to fuse or burn through the corresponding E-fuse resistor 1101c (and to thus place the corresponding, third E-fuse resistor 1101c also from a conductive, first state ("non-programmed state") in a non-conductive, second state ("programmed state").

The corresponding programming current pulse may, for instance, again be automatically generated by the control circuit in reaction to a corresponding, further (third) programming instruction signal—that is, for instance, identical to the above-mentioned first and second programming instruction signals—applied to the control circuit, and be applied to the respectively correct (here: the third) E-fuse resistor 1101c.

In the above-mentioned fourth state of the element group 1101, the first, second, and third programmable elements 1101a, 1101b, 1101c are thus in the above-mentioned second, non-conductive state ("programmed state"), and the remaining programmable elements (if available) in the above-mentioned first, conductive state ("non-programmed state").

For this reason, the first, second, and third inputs of the evaluation logic circuit 1105 are in the above-mentioned second state that corresponds, for instance, to a logic "1" (or to a logic "0"), and further inputs (if available) of the evaluation logic circuit 1105 are—still—in the above-mentioned first state that corresponds, for instance, to a logic "0" (or to a logic "1").

The output of the evaluation logic circuit 1105—i.e. the output line 1107—is thus placed from the above-mentioned first state back to the above-mentioned second state (logic "1" (or logic "0")).

In the above-mentioned fourth state of the element group 1101, it thus stores—again—a bit "1" (or a bit "0"), etc.

Other than with conventional individually used one time programmable elements, a programming that has been performed is "reversible" or may be "undone", respectively, in the element group 1101 in the manner explained above; in other words, the element group 1101 is programmable repeatedly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for programming a semiconductor device comprising:
    defining a plurality of one time programmable elements forming a group of one time programmable elements;
    leaving the one time programmable elements of the group in a non-programmed state if a first information is to be stored by the group; and
    programming a first one time programmable element of the group if a second information differing from the first information is to be stored by the group.

2. The method of claim 1, additionally comprising:
    programming a second one time programmable element of the group if the first information is to be stored again by the group.

3. The method of claim 2, additionally comprising:
    programming of the second one time programmable element of the group; and
    programming a third one time programmable element of the group if the second information is to be stored again by the group.

4. The method of claim 3, additionally comprising:
    programming a fourth one time programmable element of the group if the first information is to be stored again by the group.

5. The method of claim 1, comprising wherein the first information is a bit "0" and the second information is a bit "1".

6. The method of claim 1, comprising wherein the first information is a bit "1" and the second information is a bit "0".

7. The method of claim 1, comprising wherein the one time programmable elements are laser fuse resistors.

8. The method of claim 1, comprising wherein the one time programmable elements are E-fuse resistors.

9. A method for operating a semiconductor device comprising:
    defining a plurality of one time programmable elements forming a group of one time programmable elements;
    determining whether a first information or a second information differing from the first information is stored by the group;
    determining that the second information is stored by the group if a first one time programmable element of the group is in a programmed state, and the remaining one time programmable elements of the group are in a non-programmed state.

10. The method of claim 9, comprising determining that the first information is stored by the group if the one time programmable elements of the group are in a non-programmed state.

11. The method of claim 9, comprising determining that the first information is stored by the group if the first and second one time programmable elements of the group are in a programmed state, and the remaining one time programmable elements of the group are in a non-programmed state.

12. The method of claim 11, comprising determining that the second information is stored by the group if the first and second and a third one time programmable elements of the group are in a programmed state, and the remaining one time programmable elements of the group are in a non-programmed state.

13. A method for operating a semiconductor device comprising:
    defining a plurality of one time programmable elements forming a group of one time programmable elements;

determining whether a first information or a second information differing from the first information is stored by the group; and determining that the second information is stored by the group if an odd number of the one time programmable elements of the group is in a programmed state.

14. A semiconductor device comprising:

a plurality of one time programmable elements forming a group of one time programmable elements for storing a first information or a second information differing from the first information; and an evaluator configured for determining that the second information is stored by the group if an odd number of the one time programmable elements of the group is in a programmed state.

15. The semiconductor device of claim 14, comprising wherein the evaluator determines that the first information is stored by the group if the one time programmable elements of the group are in a non-programmed state.

16. The semiconductor device of claim 15, comprising wherein the evaluator determines that the second information is stored by the group if a first one time programmable element of the group is in a programmed state, and the remaining one time programmable elements of the group are in a non-programmed state.

17. The semiconductor device of claim 16, comprising wherein the evaluation determines that the first information is stored by the group if the first and a second one time programmable elements of the group are in a programmed state, and the remaining one time programmable elements of the group are in a non-programmed state.

18. The semiconductor device of claim 14, comprising a DRAM.

19. The semiconductor device of claim 14, comprising a memory module.

\* \* \* \* \*